(12) United States Patent
Teranishi et al.

(10) Patent No.: US 7,391,403 B2
(45) Date of Patent: Jun. 24, 2008

(54) LATCH, LATCH DRIVING METHOD, AND FLAT DISPLAY APPARATUS

(75) Inventors: Yasuyuki Teranishi, Kanagawa (JP); Yoshiharu Nakajima, Kanagawa (JP); Noboru Toyozawa, Kanagawa (JP)

(73) Assignee: Sony Corporation (JP)

( * ) Notice: Subject to any disclaimer, the term of this patent is extended or adjusted under 35 U.S.C. 154(b) by 186 days.

(21) Appl. No.: 10/542,250

(22) PCT Filed: Dec. 26, 2003

(86) PCT No.: PCT/JP03/16865

§ 371 (c)(1),
(2), (4) Date: Jul. 15, 2005

(87) PCT Pub. No.: WO2004/066259

PCT Pub. Date: Aug. 5, 2004

(65) Prior Publication Data

US 2006/0055652 A1 Mar. 16, 2006

(30) Foreign Application Priority Data

Jan. 24, 2003 (JP) .............................. 2003-015637

(51) Int. Cl.
*G09G 3/36* (2006.01)
*H03K 19/00* (2006.01)
*H03L 5/00* (2006.01)

(52) U.S. Cl. ............................ 345/98; 345/100; 326/93; 327/333

(58) Field of Classification Search ........... 345/98–100, 345/76, 82, 205; 326/62–92; 327/333
See application file for complete search history.

(56) References Cited

U.S. PATENT DOCUMENTS

| 5,724,061 | A | * | 3/1998 | Kanbara ...................... 345/100 |
| 6,008,801 | A | * | 12/1999 | Jeong ......................... 345/204 |
| 6,208,170 | B1 | * | 3/2001 | Iwaki et al. ................. 326/121 |
| 6,377,098 | B1 | * | 4/2002 | Rebeor ....................... 327/210 |
| 6,664,943 | B1 | * | 12/2003 | Nakajima et al. ............. 345/98 |
| 6,747,625 | B1 | | 6/2004 | Han et al. |

FOREIGN PATENT DOCUMENTS

EP 1014334 A2 * 6/2000

(Continued)

OTHER PUBLICATIONS

International Search Report mailed Mar. 16, 2004.

*Primary Examiner*—Richard Hjerpe
*Assistant Examiner*—Mahmoud Fatahi Yar
(74) *Attorney, Agent, or Firm*—Rader Fishman & Grauer PLLC; Ronald P. Kananen

(57) ABSTRACT

This invention applies illustratively to a horizontal driving circuit for a liquid crystal display device, and to a liquid crystal display device utilizing that horizontal driving circuit. With a CMOS latch cell 12 disconnected from power supplies VDD2 and VSS2, the input of the latch cell 12 is connected to an upstream circuit 51 so as to set corresponding data on the cell. Then with the input of the CMOS latch cell 12 disconnected from the upstream circuit 51, the power supplies VDD2 and VSS2 to the CMOS latch cell 12 are switched on to level-shift the data set on the latch cell 12.

3 Claims, 9 Drawing Sheets

FOREIGN PATENT DOCUMENTS

| | | |
|---|---|---|
| JP | 07-199873 | 8/1995 |
| JP | 11-289246 | 10/1999 |
| JP | 2000-221926 | 8/2000 |
| JP | 2000-242207 | 9/2000 |
| JP | 2000-242209 | 9/2000 |
| JP | 2002-311920 | 10/2002 |
| KR | 1020010017115 A | 3/2001 |
| WO | WO 01/18962 A1 | 3/2001 |

* cited by examiner

BACKGROUND ART

BACKGROUND ART

DATA sp

1Lout oe

2Lout

US 7,391,403 B2

LATCH, LATCH DRIVING METHOD, AND FLAT DISPLAY APPARATUS

TECHNICAL FIELD

The present invention relates to a latch, a latching method, and a flat display apparatus. Illustratively, the invention may be applied to a horizontal driving circuit for a liquid crystal display device, as well as to a liquid crystal display device utilizing that horizontal driving circuit. In an inventive setup where CMOS latch cells are disconnected from their power supplies, the input of each CMOS latch cell is connected to an upstream circuit so as to set corresponding data. The input of the CMOS latch cell in question is then disconnected from the upstream circuit while the power supplies to the CMOS latch cell are activated, so that the data set on the CMOS latch cell is level-shifted. The scheme makes the level of power dissipation lower and the apparatus structure simpler in the setup than before.

BACKGROUND ART

Recent years have seen liquid crystal display devices which, as one type of flat display apparatus for use in portable terminal equipment, such as PDA's and mobile phones, have LCD panel driving circuits formed integrally with a glass substrate serving as an insulating substrate constituting part of the LCD panel.

The above type of liquid crystal display device has come to adopt a method for generating driving signals by converting video data from a digital to an analog format through the selection of a plurality of reference voltages in keeping with the video data in question, as disclosed illustratively in Japanese Published Unexamined Patent Application No. 2000-242209.

FIG. 1 is a connection diagram showing a digital-to-analog converter operating through the use of the above method. The digital-to-analog converter 1 includes a plurality of series circuits corresponding to the number of gradations involved, each of the series circuits being composed of switching circuits that are turned on and off depending on the logical values of bits b0 through b4 constituting video data D1. One end of these series circuits is supplied with reference voltages V0 through V31, and the other end of the series circuits is connected to a column line SIGOUT of a liquid display panel. What is shown in FIG. 1 is a setup where the video data D1 occurs in five bits, where the switching circuits are each made of a conductive MOS (Metal Oxide Semiconductor) transistor, and where N and P channels are disposed suitably to select a corresponding reference voltage depending on the values of the video data D1. The digital-to-analog converter 1 is thus arranged to select and output the reference voltages V0 through V31 in accordance with the video data D1.

With the digital-to-analog converter 1 structured as outlined above, this type of liquid crystal display device causes the bits b0 through b4 of the video data D1 to be level-shifted for input to the converter 1. The level-shift arrangement is designed to turn on and off unfailingly the conductive MOS transistors that make up the switching circuits in the digital-to-analog converter.

FIG. 2 is a connection diagram showing a processing block for handling one bit of the video data D1 that is input to the digital-to-analog converter 1. This type of liquid crystal display device has as many one-bit processing blocks as the number of bits constituting the video data D1. The one-bit processing block combines with the digital-to-analog converter 1 of FIG. 1 to form a structure that establishes the gradation of a single liquid crystal cell. A plurality of such structures are furnished to address the liquid crystal cells that are disposed in a horizontally continuous fashion, whereby a horizontal driving circuit is formed.

The one-bit processing block is constituted by a sampling latch 3 and a second latch 4. The sampling latch 3 samples in a suitably timed manner the video data "DATA" input in the raster scan sequence. The second latch 4 serves to latch the latched result from the sampling latch 3 at horizontal scanning intervals before the result is level-shifted.

The sampling latch 3 has CMOS inverters 5 and 6 connected in parallel between a power supply VDD1 and ground. The CMOS inverter 5 is made of an N-channel MOS (called NMOS) transistor Q1 and a P-channel MOS (called PMOS) transistor Q2 with their gates and drains connected in common. Likewise, the CMOS inverter 6 is constituted by an NMOS transistor Q3 and a PMOS transistor Q4 with their gates and drains connected in common. In the sampling latch 3, the output of the CMOS inverter 5 is input to the CMOS inverter 6. The output of the CMOS inverter 6 is input to the CMOS inverter 5 through the NMOS transistor Q5 that is turned on and off by an inverted signal of a sampling pulse "sp." This setup in the sampling latch 3 constitutes a CMOS latch cell 7 of a comparator structure. In the sampling latch 3, one-bit video data "DATA" is input to the CMOS inverter 5 through the NMOS transistor Q6 that is turned on and off by the sampling pulse "sp." The data "DATA" has its signal level changed approximately between 0 and 3 V depending on the logical value.

In the sampling latch 3, the latched result from the CMOS latch cell 7 of the comparator structure is input to a CMOS inverter 8 made up of a NMOS transistor Q7 and a PMOS transistor Q8. From the CMOS inverter 8, the result is forwarded to the second latch 4. An inverted output of the CMOS inverter 8 is output to the second latch 4 through a CMOS inverter 9 formed by an NMOS transistor Q9 and a PMOS transistor Q10. The sampling latch 3, as shown in FIGS. 3A through 3F, thus latches the data "DATA" (FIG. 3A) in keeping with the sampling pulse "sp" (FIG. 3B) and outputs the latched result 1Lout (FIG. 3C).

In the second latch 4, CMOS inverters 10 and 11 constitute a CMOS latch cell 12 of a comparator structure. The CMOS inverter 10 is made up of an NMOS transistor Q11 and a PMOS transistor Q12, and the CMOS inverter 11 is composed of an NMOS transistor Q13 and a PMOS transistor Q14. The latched result 1Lout from the sampling latch 3 and an inverted output of the latched result 1Lout are input to the CMOS latch cell 12 through NMOS transistors Q15 and Q16 activated by a latch pulse "oe1."

In the second latch 4, the CMOS latch cell 12 is connected to a ground VSS1 and a negative power supply VSS2 through NMOS transistors Q17 and Q19 that are turned on and off complementarily by an inverted signal "xoe2" of the pulse "oe2." Likewise the CMOS latch cell 12 is connected to power supplies VDD2 and VDD1 through PMOS transistors Q20 and Q22. The second latch 4 feeds the output of the CMOS latch cell 12 to the corresponding bit of the digital-to-analog converter 1 through a CMOS inverter 13 made up of an NMOS transistor Q23 and a PMOS transistor Q24. In the second latch 4, the pulse "oe2" (FIG. 3E) is provided so as to set the CMOS latch cell 12 (at time t1) to the same power supply VDD1 that is used by the sampling latch 3. Thereafter, the latched result from the sampling latch 3 is latched (at time t2) by the CMOS latch cell 12 in accordance with the latch pulse "oe1" (FIG. 3D). With the latched result thus latched by the CMOS latch cell 12, the sampling latch 3 is disconnected (at time t3) on a trailing edge of the latch pulse "oe1." Then the power supply voltage for the CMOS latch cell 12 is switched (at time t4) on a trailing edge of the pulse "oe2," whereby the latched result is level-shifted for output (FIG. 3F).

In the second latch 4 described above with reference to FIG. 2, the transistors Q20 and Q22, which should act complementarily to switch the power supplies for the CMOS latch cell 12, cannot be entirely prevented from going on simultaneously. The instantaneously concurrent activation of the two transistors incurs a large amount of momentary power dissipation. More specifically, flow-through currents can take place from the power supply VDD2 to the power supply VDD1 or from the power supply VSS1 to the power supply VSS2.

If such momentary flow-currents are prevented, this will reduce power dissipation of the above type of flat display apparatus and contribute to improving its ease of use.

If the structure of the second latch 4 is made simpler, this will provide the above type of display apparatus with a narrower display framework than before.

DISCLOSURE OF INVENTION

The present invention has been made in view of the above circumstances and proposes a latch, a latch driving method, and a flat display apparatus requiring less power dissipation while utilizing a more simplified apparatus structure than before.

According to one embodiment of the present invention, there is provided a latch either for sampling and latching continuous video data or for latching a latched result from an upstream sampling latch, the latch including: a CMOS latch cell; a power switch for connecting the CMOS latch cell to a power supply; and an input switch disposed at an input of the CMOS latch cell; wherein the power switch and the input switch are switched on and off complementarily in such a manner that, with the CMOS latch cell disconnected from the power supply, data to be latched are set on the CMOS latch cell and that, with the input of the CMOS latch cell disconnected from the upstream sampling latch, the power supply to the CMOS latch cell is switched on to level-shift the data set on the CMOS latch cell.

Where the above latch is in use, the power switch and the input switch are switched on and off complementarily so that, with the CMOS latch cell disconnected from the power supply, the target data to be latched is set on the CMOS latch. Thereafter, with the input of the CMOS latch disconnected from the upstream circuit, the power supply to the CMOS latch cell is switched on to level-shift the data set on the CMOS latch cell. The connection and disconnection of the latch cell to and from the power supply are suitably controlled so as to effectively avert flow-through currents that may occur upon power supply switchover. With the flow-through current suppressed, power dissipation is reduced correspondingly. When the procedure of power supply control is simplified, the entire device structure is streamlined.

According to another embodiment of the present invention, there is provided a latch driving method for driving a latch including a CMOS latch cell either for sampling and latching continuous video data or for latching a latched result from an upstream sampling latch, the latch driving method including the steps of: with the CMOS latch cell disconnected from a power supply, connecting an input of the CMOS latch cell to an upstream circuit so as to set corresponding data on the CMOS latch cell; and with the input of the CMOS latch cell disconnected from the upstream circuit, switching on the power supply to the CMOS latch cell so as to level-shift the data set on the CMOS latch cell.

The inventive latch driving method arranged as outlined above serves to keep power dissipation lower through the use of a simpler device structure than before.

According to a further embodiment of the present invention, there is provided a flat display apparatus including a display unit with pixels disposed in a matrix, and driving circuits for driving pixels of the display unit, the display unit and the driving circuits being formed integrally on a substrate; wherein the driving circuits include a horizontal driving circuit for setting gradations for the pixels of the display unit, the horizontal driving circuit including: a sampling latch for successively latching continuous video data; a second latch for latching a latched result from the sampling latch on a line-by-line basis; and a digital-to-analog converter for converting an output of the second latch from digital to analog form for output to the display unit; and wherein either the sampling latch or the second latch acts in such a manner that, with a CMOS latch cell disconnected from a power supply, an input of the CMOS latch cell is connected to an upstream circuit so as to set corresponding data on the CMOS latch cell and that, with the input of the CMOS latch cell disconnected from the upstream circuit, the power supply to the CMOS latch cell is switched on to level-shift the data set on the CMOS latch cell.

The flat display apparatus practiced according to the invention, as outlined above, is an apparatus that consumes less power while operating on a simpler structure than before.

BEST MODE FOR CARRYING OUT THE INVENTION

Preferred embodiments of the present invention will now be described with reference to the accompanying drawings.

(1) First Embodiment

Figure 4:
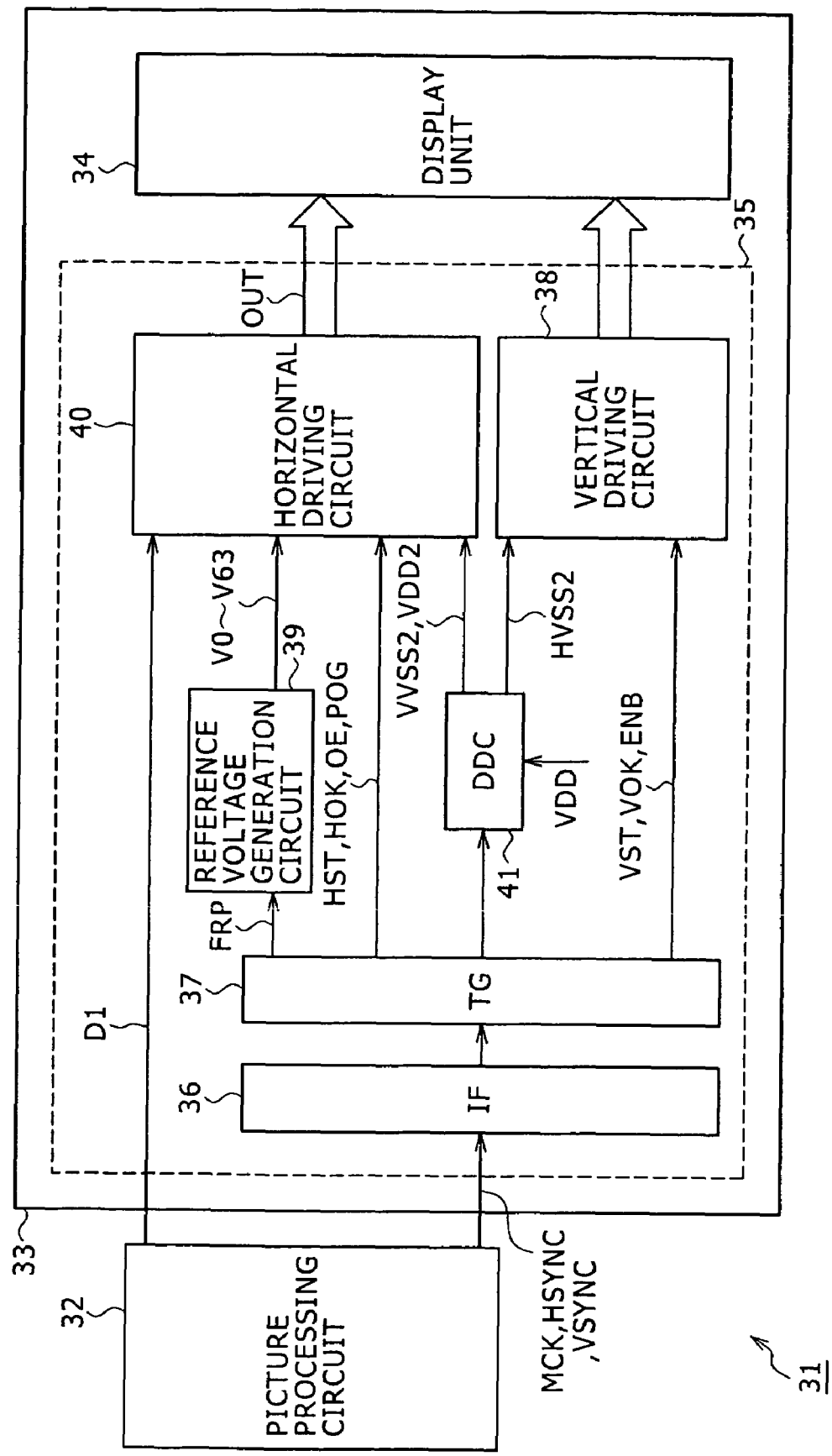
FIG. 4 is a block diagram of a portable terminal apparatus which is practiced as a first embodiment of this invention and which has a liquid crystal display unit incorporating a sampling latch and a second latch.

FIG. 4 is a block diagram of a portable terminal apparatus practiced as the first embodiment of this invention highlighting a picture display unit. The portable terminal apparatus is illustratively a mobile phone or a PDA. The picture display unit 31, designed to display desired pictures, has a picture processing circuit 32 incorporating a video memory that accommodates video data D1. The video data D1 is output successively to a liquid crystal display device 33. In synchronism with output of the video data D1, the picture processing circuit 32 outputs a master clock signal MCK, a vertical synchronizing signal VSYNC and a horizontal synchronizing signal HSYNC.

The inventive portable terminal apparatus inputs the video data D1 as well as the master clock signal MCK, a vertical synchronizing signal VSYNC and a horizontal synchronizing signal HSYNC to the internal liquid crystal display device 33, which in turn displays pictures. The liquid crystal display device 33 is a flat display apparatus constituted by a display unit 34 having pixels disposed in a matrix and by a driving circuit 35 for driving the pixels of the display unit 34, the display unit 34 and driving circuit 35 being disposed integrally on a glass substrate. With this embodiment, the pixels of the display unit 34 are constituted by liquid crystal cells, by polysilicon TFT's for switching the cells, and by auxiliary capacitors.

The driving circuit 35 has the master clock signal MCK, the vertical synchronizing signal VSYNC, and the horizontal synchronizing signal HSYNC input to a timing generator (TG) 37 through an interface (IF) 36. In turn, the timing generator 37 generates various timing signals for operation reference purposes. Acting on relevant timing signals coming from the timing generator 37, a DC-DC converter (DDC) 41 generates power supplies VDD2, VVSS2, and HVSS2 derived from a power source VDD fed to the liquid crystal display device 33. The power supplies thus generated are needed for activating diverse components.

Acting likewise on relevant timing signals from the timing generator 37, a vertical driving circuit 38 outputs selection signals for selecting lines of the display unit 34. A reference voltage generation circuit 39 generates reference voltages necessary for processing by a horizontal driving circuit 40. The horizontal driving circuit 40 sets gradations for those pixels of the display unit 34 which correspond to gradation data derived from the video data D1.

Figure 1:
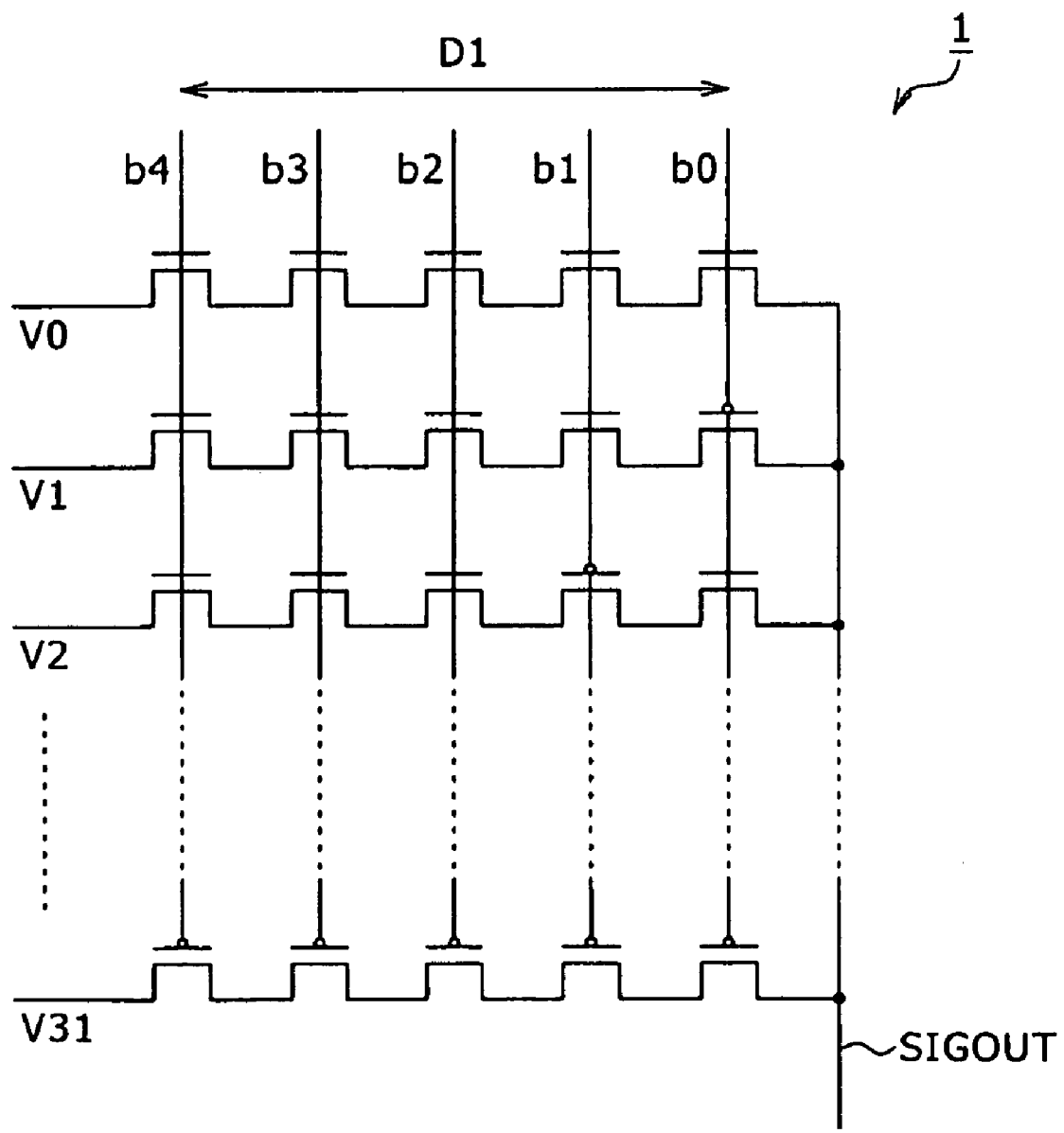
FIG. 1 is a connection diagram showing a digital-to-analog converter operating on the technique of selecting reference voltages.
Figure 5:
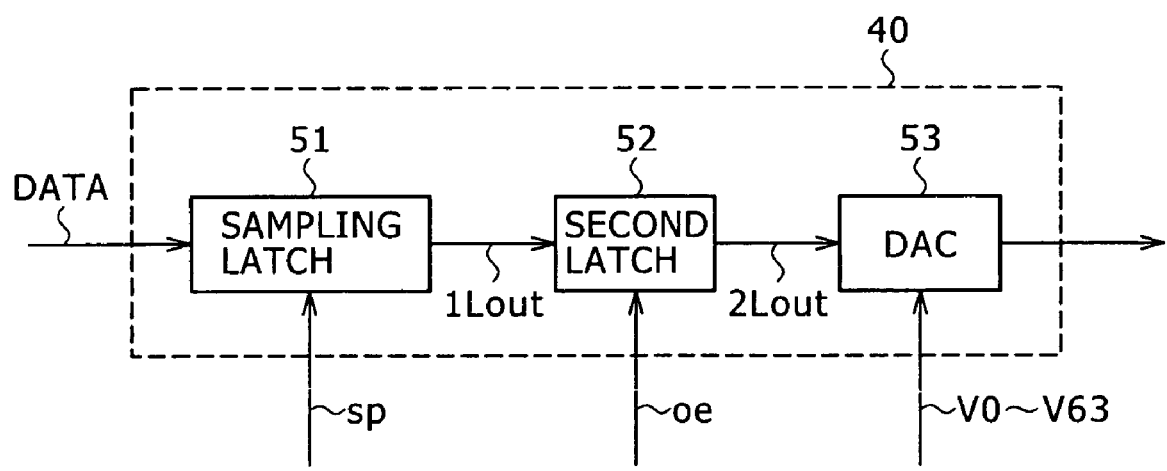
FIG. 5 is a block diagram of a horizontal driving circuit shown in FIG. 4.

In the first embodiment, the horizontal driving circuit 40 is made up of a sampling latch 51, a second latch 52, and a digital-to-analog converter (DAC) 53, as shown in FIG. 5. The digital-to-analog converter 53 has the same structure as that of the digital-to-analog converter 1 discussed above with reference to FIG. 1.

Figure 2:
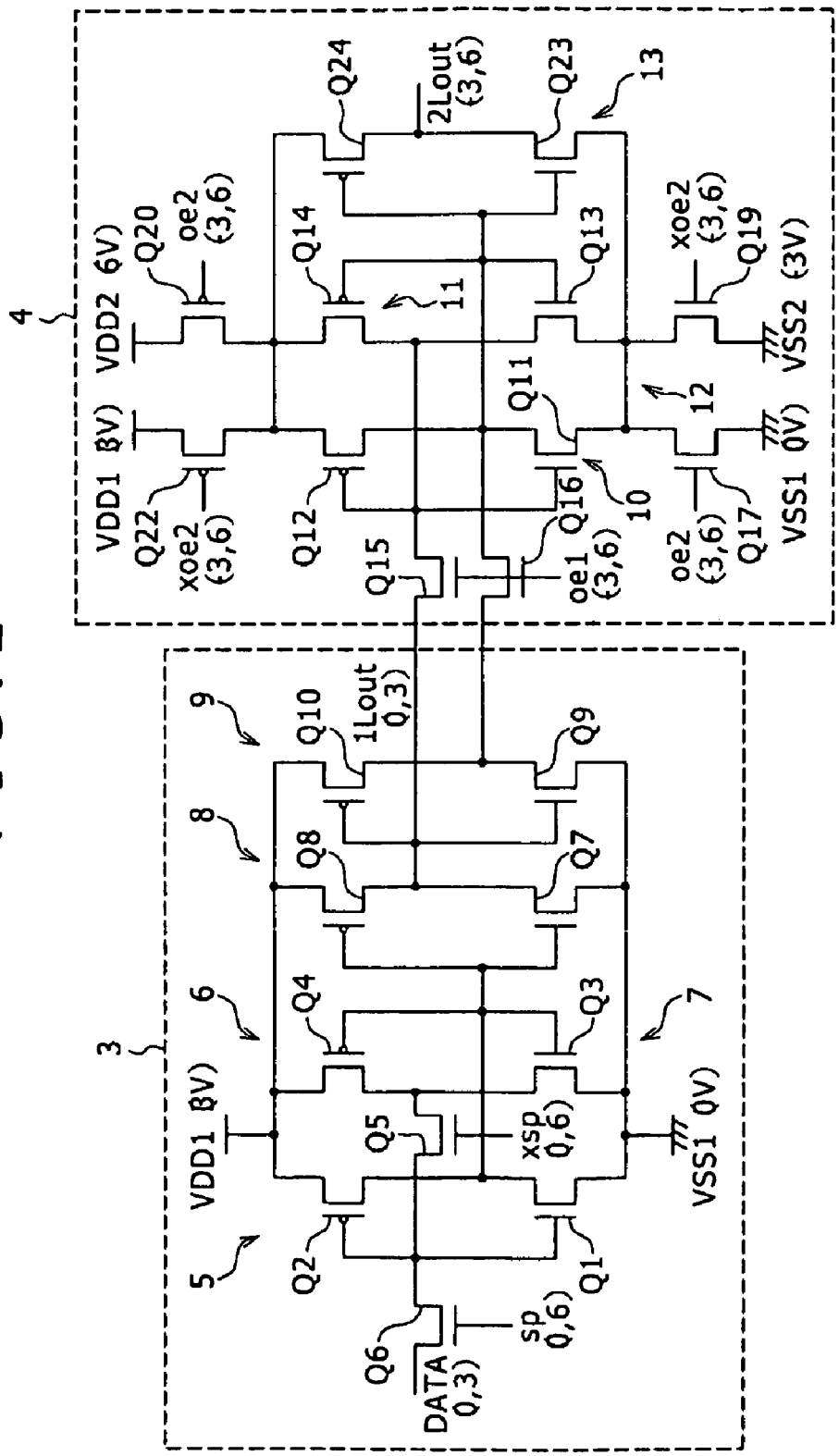
FIG. 2 is a connection diagram showing a sampling latch and a second latch which are implemented conventionally.
Figure 3:
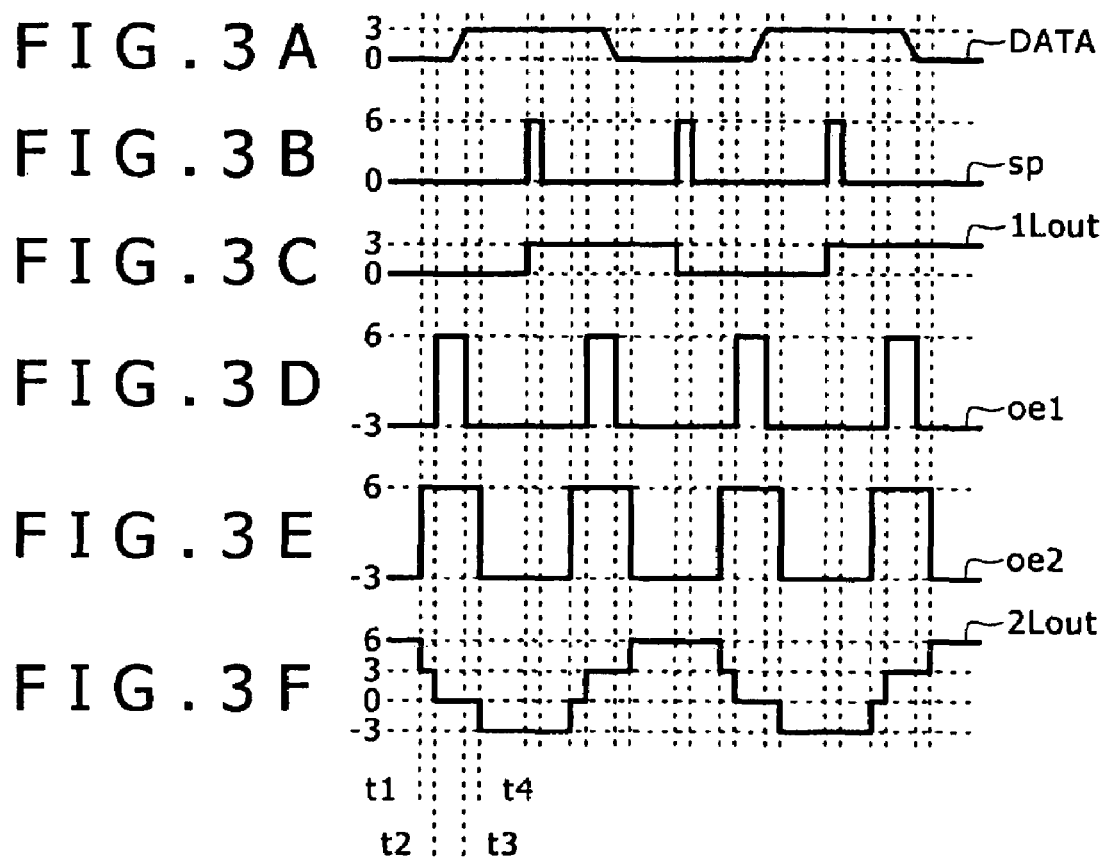
FIGS. 3A through 3F are timing charts showing typical timings in effect when the sampling latch and the second latch in FIG. 2 operate.
Figure 6:
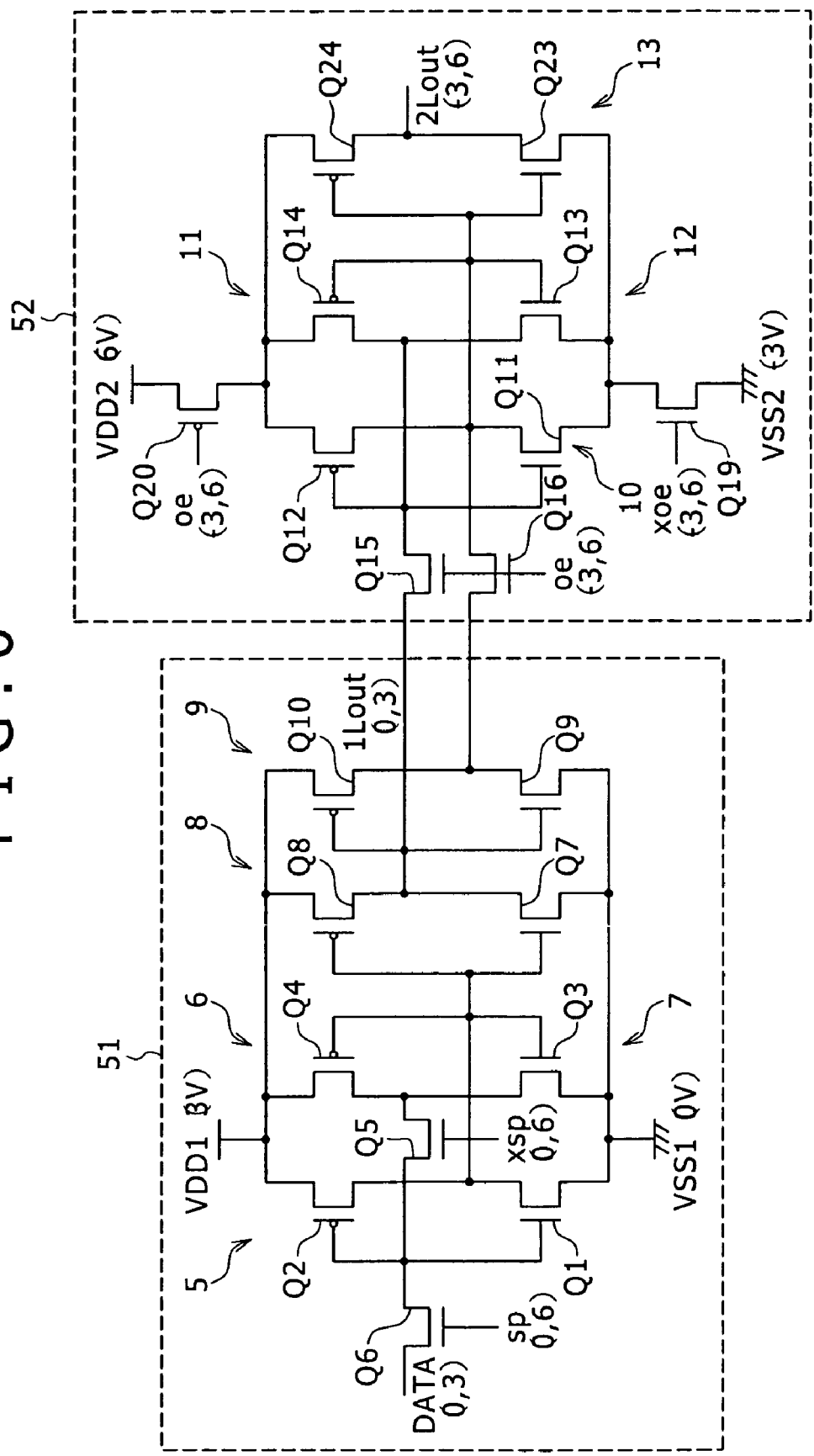
FIG. 6 is a connection diagram of the sampling latch and the second latch included in FIG. 4.

The sampling latch 51, as shown in FIG. 6, has the same structure as that of the sampling latch 3 described above with reference to FIG. 2. The second latch 52, meanwhile, has basically the same structure as that of the conventional second latch 4 described above with reference to FIG. 2, except that the transistors Q22 and Q17 disposed at the power supply and the ground respectively are removed and that the transistors Q19 and Q20 are commonly controlled by use of an output enable signal "oe" for control over the input of the second latch 52.

As shown in FIGS. 7A through 7E, the sampling latch 51 latches data "DATA" (FIG. 7A) having an amplitude of 0 to 3 V in keeping with a sampling pulse "sp" (FIG. 7B) having an amplitude of 0 to 6 V, and outputs a latched result 1Lout (FIG. 7C) having an amplitude of 0 to 3 V. The latching action takes place in the same manner as in conventional setups.

Figure 7A:
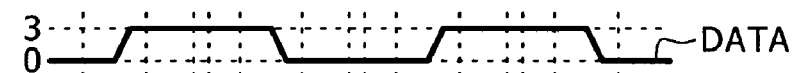
FIGS. 7A through 7E are timing charts showing typical timings in effect when the sampling latch and the second latch in FIG. 6 operate.
Figure 7B:
Figure 7C:
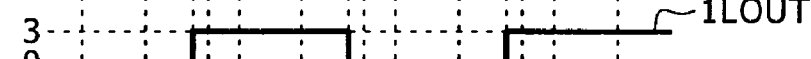
Figure 7D:
Figure 7E:
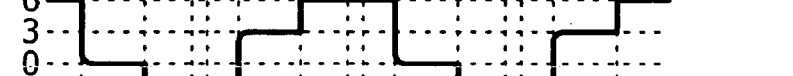

In the second latch 52, an output enable pulse "oe" (FIG. 7D) having an amplitude of −3 to 6 V rises at a time t1. This causes the latched result 1Lout (FIG. 7C) from the sampling latch 51 to be transferred to the gates of the transistors Q11 through Q14 making up the CMOS inverters 10 and 11 (FIG. 7E). When the output enable pulse "oe" subsequently falls at a time t2, the second latch 52 is disconnected from the sampling latch 51 and the CMOS latch cell 12 is connected to the power supply VDD2. This allows a level-shifted data signal 2Lout to be output.

In the first embodiment, as described, the CMOS latch cell 12 of the CMOS structure for latch use is first disconnected from the power supplies VDD2 and VSS2. The target data to be latched is then set on the CMOS latch cell 12, before the input of the CMOS latch cell 12 is disconnected from the upstream circuit. At the same time, the power supplies to the CMOS latch cell 12 are switched on using the transistors Q19 and Q20. This arrangement allows the data signal 2Lout to be level-shifted for output without having to switch the two power supplies VDD1 and VDD2 conventionally using the transistors Q22 and Q20.

This means the horizontal driving circuit 40 can eliminate two transistors per bit in the second latch. This amounts to an appreciably simplified structure offering a narrower display framework than before. It is also possible to suppress flow-through currents stemming from power supply switchover, whereby power dissipation is lowered correspondingly. Because the power supply wiring is streamlined concomitantly, the overall device structure is made simpler than before.

According to the configuration of the first embodiment above, with the CMOS latch cell 12 for latch use disconnected from the power supplies VDD2 and VSS2, the data to be latched is set on the CMOS latch cell 12. Then with the input of the CMOS latch cell 12 disconnected from the upstream circuit, the power supplies to the CMOS latch cell 12 are switched on using the transistors Q19 and Q20. The embodiment thus allows the data signal to be level-shifted for output without having to switch the two power supplies VDD1 and VDD2 conventionally using the transistors Q22 and Q20. The inventive setup provides for less power dissipation and a more simplified device structure than before.

(2) Second Embodiment

Figure 8:
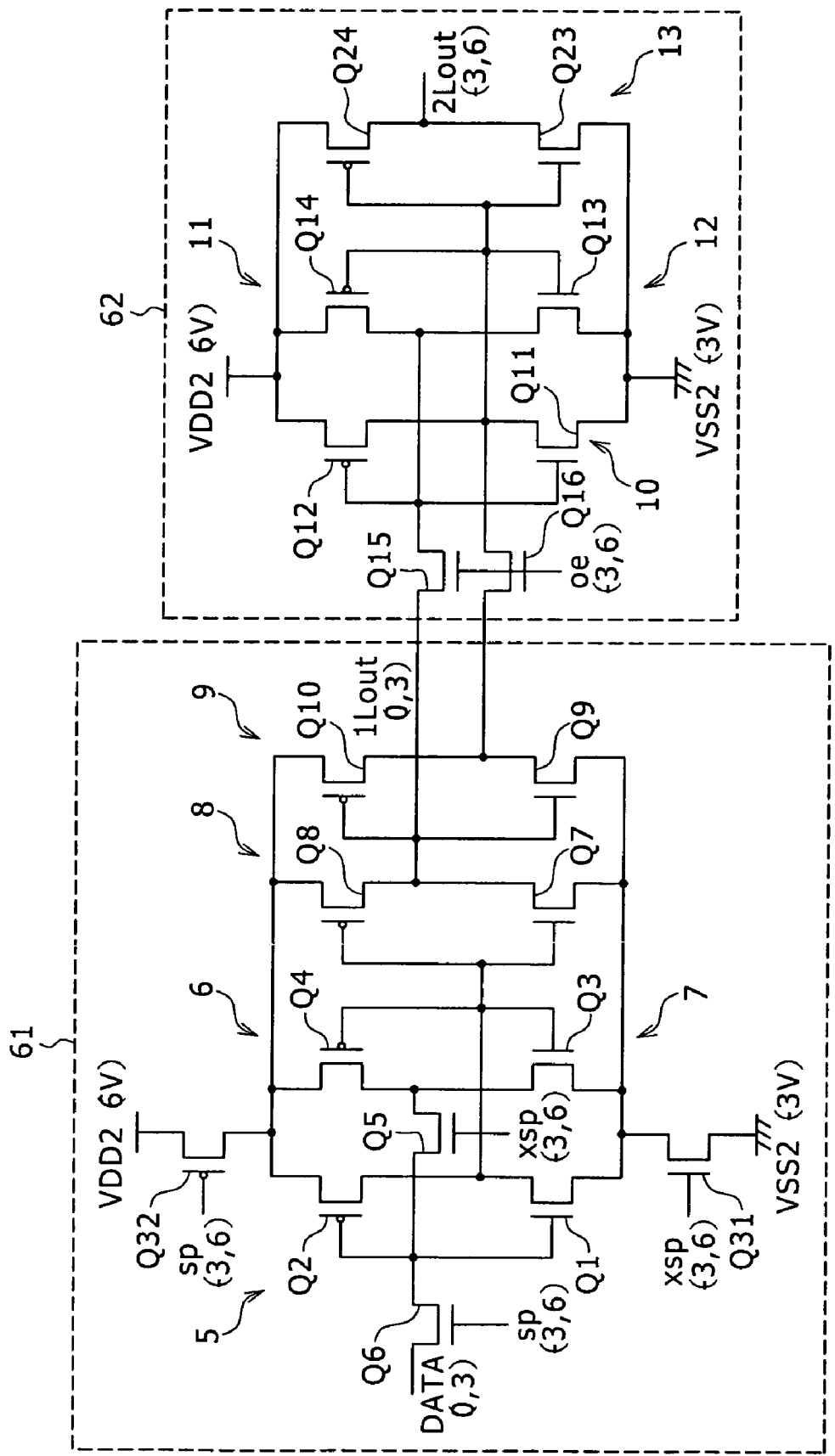
FIG. 8 is a connection diagram of a sampling latch and a second latch which are practiced as a second embodiment of this invention.

FIG. 8 is a connection diagram of a sampling latch 61 and a second latch 62 which are practiced as a second embodiment of this invention. These latches replace the sampling latch 51 and the second latch 52 discussed above with reference to FIG. 6.

Figure 9A:
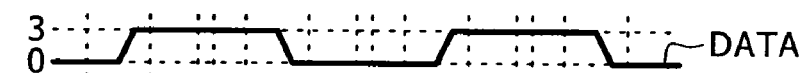
FIGS. 9A through 9E are timing charts showing typical timings in effect when the sampling latch and the second latch in FIG. 8 operate.
Figure 9B:
Figure 9C:
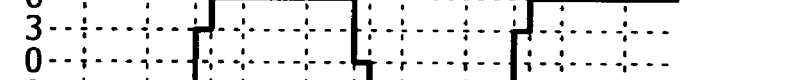
Figure 9D:
Figure 9E:

The sampling latch 61 and the second latch 62 work to have the sampling latch 61 both latch and level-shift target data. More specifically, in the sampling latch 61, a CMOS latch cell 7 is connected to power supplies through transistors Q31 and Q32 that are turned on and off in keeping with a sampling pulse "sp." As shown in FIGS. 9A through 9E, with the CMOS latch cell 7 disconnected from the power supplies VDD2 and VSS2, the data to be latched is set on the CMOS latch cell 7 (FIGS. 9A through 9C). Thereafter, with the input of the CMOS latch cell 7 disconnected from the upstream circuit, the power supplies to the latch cell 7 are switched on using the transistors Q31 and Q32. This causes the sampling latch 61 to level-shift the data first and then prompts the second latch 62 to latch the result (FIGS. 9D and 9E).

In this manner, the level-shift operation may be carried out on the sampling latch side as well, and the same effects as those provided by the first embodiment are also made available.

(3) Other Embodiments

In the above-described embodiments, the processing block for each bit of each pixel was shown furnished with the transistors Q19 and Q20 or with Q31 and Q32. However, this is not limitative of the invention. Alternatively, the processing blocks may be organized into groups each provided with these transistors for collective control over the power supplies. As another alternative, the power supplies may be controlled collectively for all processing blocks.

In the embodiments described above, liquid crystal cells were shown to be driven. Alternatively, the present invention may be applied extensively to flat display apparatuses with their pixels constituted by varieties of displaying means.

As described and according to the invention, with a CMOS latch cell disconnected from power supplies, the input of the latch cell is connected to an upstream circuit so as to set corresponding data on the cell. Then with the input of the CMOS latch cell disconnected from the upstream circuit, the power supplies to the CMOS latch cell are switched on to level-shift the data set on the latch cell. The inventive scheme thus provides for lower power dissipation and a more simplified device structure than before.

INDUSTRIAL APPLICABILITY

The present invention relates to a latch, a latch driving method, and a flat display apparatus. Illustratively, the invention may be applied to a horizontal driving circuit for a liquid crystal display device, and to a liquid crystal display device incorporating that horizontal driving circuit.

The invention claimed is:

1. A latch for latching a latched result from an upstream sampling latch, the latch comprising:
   a CMOS latch cell;
   a power switch for connecting said CMOS latch cell to a power supply; and
   an input switch disposed at an input of said CMOS latch cell;
   wherein said power switch and said input switch are switched on and off complementarily in such a manner:
      with said CMOS latch cell disconnected from said power supply, data to be latched is set on said CMOS latch cell, and
      with said input of said CMOS latch cell disconnected from the upstream sampling latch, said power supply to said CMOS latch cell is switched on to level-shift the data set on said CMOS latch cell.

2. A latch driving method for driving a latch comprising a CMOS latch cell for latching a latched result from an upstream sampling latch, the latch driving method comprising the steps of:
   with said CMOS latch cell disconnected from a power supply, connecting an input of said CMOS latch cell to the upstream sampling latch so as to set corresponding data on said CMOS latch cell; and
   with said input of said CMOS latch cell disconnected from said upstream sampling latch, switching on said power supply to said CMOS latch cell so as to level-shift the data set on said CMOS latch cell.

3. A flat display apparatus comprising a display unit with pixels disposed in a matrix, and driving circuits for driving pixels of said display unit, said display unit and said driving circuits being formed integrally on a substrate;
   wherein said driving circuits include a horizontal driving circuit for setting gradations for said pixels of said display unit, said horizontal driving circuit including:
      a sampling latch for successively latching continuous video data;
      a second latch for latching a latched result from said sampling latch on a line-by-line basis; and
      a digital-to-analog converter circuit for converting an output of said second latch from digital to analog form for output to said display unit; and
   wherein either said sampling latch or said second latch acts in such a manner:
      with a CMOS latch cell disconnected from a power supply, an input of said CMOS latch cell is connected to the upstream sampling latch so as to set corresponding data on said CMOS latch cell, and
      with said input of said CMOS latch cell disconnected from said upstream sampling latch, said power supply to said CMOS latch cell is switched on to level-shift the data set on said CMOS latch cell.

* * * * *